(12) United States Patent
Kim et al.

(10) Patent No.: US 12,648,453 B2
(45) Date of Patent: *Jun. 2, 2026

(54) SOLDER REFLOW APPARATUS AND METHOD OF MANUFACTURING ELECTRONIC DEVICE

(71) Applicant: Samsung Electronics Co., Ltd., Suwon-si (KR)

(72) Inventors: Youngja Kim, Suwon-si (KR); Minwoo Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

This patent is subject to a terminal disclaimer.

(21) Appl. No.: 18/436,934

(22) Filed: Feb. 8, 2024

(65) Prior Publication Data

US 2024/0355640 A1 Oct. 24, 2024

(30) Foreign Application Priority Data

Apr. 19, 2023 (KR) ........................ 10-2023-0051435

(51) Int. Cl.
*B23K 1/00* (2006.01)
*B23K 1/012* (2006.01)
*H10P 72/00* (2026.01)
*H10W 70/05* (2026.01)
*B23K 101/40* (2006.01)

(52) U.S. Cl.
CPC .......... *H10W 70/093* (2026.01); *B23K 1/012* (2013.01); *H10P 72/0434* (2026.01); *H10W 70/098* (2026.01); *B23K 2101/40* (2018.08)

(58) Field of Classification Search
CPC ........ B23K 1/008; B23K 1/012; B23K 1/015; B23K 3/08; B23K 3/00; B23K 3/087; B23K 37/0282
See application file for complete search history.

(56) References Cited

U.S. PATENT DOCUMENTS 4,558,524 A 12/1985 Peck et al.
4,909,430 A * 3/1990 Yokota ................... B23K 1/012
219/400

(Continued)

FOREIGN PATENT DOCUMENTS

KR 101128745 B1 3/2012

*Primary Examiner* — Erin B Saad

(74) *Attorney, Agent, or Firm* — Wolf, Greenfield & Sacks, P.C.

(57) ABSTRACT

In a method of manufacturing an electronic device, a substrate including a plurality of bonding pads on a first surface thereof is provided. Solder members are attached on the plurality of bonding pads respectively. An airflow control cover is positioned on the first surface of the substrate above the solder members, the airflow control cover including a plurality of vapor passage holes that allows air to flow toward the solder members. The substrate on which the airflow control cover is positioned is loaded into a vapor generating chamber that accommodates a heat transfer fluid therein. The heat transfer fluid is heated to place the heat transfer fluid in a vapor state within the chamber. The solder members are soldered by supplying the heat transfer fluid in the vapor state to surfaces of the solder members through the vapor passage holes of the airflow control cover.

20 Claims, 20 Drawing Sheets

(56) References Cited

U.S. PATENT DOCUMENTS

| | | | | |
|---|---|---|---|---|
| 6,008,071 | A * | 12/1999 | Karasawa | H05K 3/3457 |
| | | | | 438/115 |
| 6,152,353 | A * | 11/2000 | Sani-Bakhtiari | H05K 3/3421 |
| | | | | 228/180.1 |
| 7,380,699 | B2 * | 6/2008 | Dokkedahl | B23K 1/015 |
| | | | | 228/33 |
| 7,833,897 | B2 * | 11/2010 | Knickerbocker | B23K 3/0623 |
| | | | | 438/612 |
| 8,225,983 | B2 | 7/2012 | Takahashi | |
| 8,360,305 | B2 | 1/2013 | Davies | |
| 8,420,169 | B2 | 4/2013 | Negishi | |
| 10,875,114 | B2 * | 12/2020 | Nagai | B23K 1/0016 |
| 11,504,786 | B2 * | 11/2022 | Rehm | B23K 1/015 |
| 11,940,693 | B2 * | 3/2024 | Kim | G02F 1/133388 |
| 2010/0170439 | A1 | 7/2010 | Negishi | |
| 2010/0170444 | A1 | 7/2010 | Negishi | |
| 2010/0209609 | A1 | 8/2010 | Negishi et al. | |
| 2011/0248074 | A1 * | 10/2011 | Davies | B23K 1/008 |
| | | | | 228/19 |
| 2017/0014929 | A1 * | 1/2017 | So | H01L 21/4882 |
| 2019/0314917 | A1 * | 10/2019 | Nagai | B23K 1/0016 |
| 2022/0143729 | A1 * | 5/2022 | Takeuchi | H01L 21/60 |
| 2023/0347437 | A1 * | 11/2023 | Hiyama | B23K 1/008 |
| 2024/0049400 | A1 * | 2/2024 | Kim | H01L 24/13 |
| 2024/0293884 | A1 * | 9/2024 | Kim | H01L 21/56 |
| 2024/0355640 | A1 * | 10/2024 | Kim | H01L 21/4853 |
| 2025/0033132 | A1 * | 1/2025 | Kim | B23K 3/085 |

* cited by examiner

SOLDER REFLOW APPARATUS AND METHOD OF MANUFACTURING ELECTRONIC DEVICE

PRIORITY STATEMENT

This application claims priority under 35 U.S.C. § 119 to Korean Patent Application No. 10-2023-0051435, filed on Apr. 19, 2023 in the Korean Intellectual Property Office (KIPO), the contents of which are herein incorporated by reference in their entirety.

BACKGROUND

Example embodiments relate to a solder reflow apparatus and a method of manufacturing an electronic device using the same. More particularly, example embodiments relate to a solder reflow apparatus using a vapor phase soldering method and a method of manufacturing a semiconductor package using the same.

A convection reflow method, a laser assisted bonding method, a vapor phase soldering method, or the like may be used to solder a solder paste in the field of surface mount technology (SMT). In case of the vapor phase soldering method, when reflowing solder balls on bonding pads of a substrate such as a printed circuit board (PCB), as diameters and volumes of the solder balls decrease, the airflow around the solder balls or a heat transfer fluid condensed from a gaseous state to a liquid state on the substrate surface may move the solder balls, resulting in solder ball mounting defects.

SUMMARY

Example embodiments provide a method of manufacturing an electronic device capable of preventing solder ball mounting defects.

Example embodiments provide a solder reflow apparatus for performing the above manufacturing method.

According to example embodiments, a method of manufacturing an electronic device includes: providing a substrate including a plurality of bonding pads on a first surface of the substrate; attaching solder members on the plurality of bonding pads respectively; positioning an airflow control cover on the first surface of the substrate above the solder members, the airflow control cover including a plurality of vapor passage holes through which air is allowed to flow toward the solder members; loading the substrate on which the airflow control cover is positioned into a vapor generating chamber that accommodates a heat transfer fluid therein; heating the heat transfer fluid to place the heat transfer fluid in a vapor state within the chamber; and soldering the solder members by supplying the heat transfer fluid in the vapor state to surfaces of the solder members through the plurality of the vapor passage holes of the airflow control cover.

According to example embodiments, a method of manufacturing an electronic device includes: providing a substrate including a plurality of bonding pads on a first surface of the substrate; attaching solder members on respective ones of the plurality of bonding pads; positioning an airflow control cover on the first surface of the substrate above the solder members, the airflow control cover including a plurality of vapor passage holes through which air is allowed to flow toward the solder members; loading the substrate on which the one airflow control cover is positioned into a vapor generating chamber that accommodates a heat transfer fluid therein; heating the heat transfer fluid to place the heat transfer fluid in a vapor state within the chamber; and soldering the solder members by supplying the heat transfer fluid in the vapor state to surfaces of the solder members through the plurality of the vapor passage holes of the airflow control cover.

According to example embodiments, a method of manufacturing an electronic device includes: providing a substrate including a plurality of bonding pads on a first surface of the substrate; coating a solder paste on the plurality of bonding pads; attaching solder members on the plurality of bonding pads respectively; positioning an airflow control cover on the first surface of the substrate above the solder members, the airflow control cover including a plurality of vapor passage holes through which air is allowed to flow toward the solder members; loading the substrate on which the one airflow control cover is positioned into a vapor generating chamber that accommodates a heat transfer fluid therein; heating the heat transfer fluid to place the heat transfer fluid in a vapor state within the chamber; and soldering the solder members by supplying the heat transfer fluid in the vapor state to surfaces of the solder members through the plurality of the vapor passage holes of the airflow control cover.

According to example embodiments, a solder reflow apparatus includes: a vapor generating chamber configured to accommodate a heat transfer fluid and to be filled with saturated vapor generated when the heat transfer fluid is heated; a heater configured to heat the heat transfer fluid accommodated within the vapor generating chamber; a substrate stage that is movable upward and downward in the vapor generating chamber, the substrate stage including a seating surface configured to receive a substrate on which solder members are attached; and an airflow control cover on the substrate stage to cover or above the solder members, the airflow control cover including a plurality of vapor passage holes through which air is allowed to flow toward the solder members.

According to example embodiments, solder balls may be attached to bonding pads on a first surface of a substrate, at least one airflow control cover may be disposed on the first surface of the substrate to cover the solder balls, and the solder balls may be reflowed by a vapor phase reflow method.

The substrate on which the airflow control cover is disposed may be loaded into a vapor generating chamber of a solder reflow apparatus, and a heat transfer fluid in a vapor state may be brought into contact with the solder balls and the substrate surface through vapor passage holes of the airflow control cover. At this time, the heat transfer fluid in the vapor state that has passed through the vapor passage holes of the airflow control cover may generate a drag force that presses an upper surface of each of the solder balls to fix the position of each of the solder balls.

Accordingly, the airflow control cover may control the airflow directed to the solder balls without directly contacting the solder balls, to thereby prevent the solder balls from moving when the solder balls are reflowed. Thus, when the solder balls are reflowed by the vapor phase soldering method, solder ball mounting defects due to misalignment of the solder balls may be prevented.

BRIEF DESCRIPTION OF THE DRAWINGS

Example embodiments will be more clearly understood from the following detailed description taken in conjunction with the accompanying drawings. FIGS. 1 to 19 represent non-limiting, example embodiments as described herein.

FIG. 1 is a cross-sectional view illustrating a solder reflow apparatus in accordance with example embodiments.

FIG. 2 is a side view illustrating the solder reflow apparatus of FIG. 1.

FIG. 3 is a perspective view illustrating a substrate stage of the solder reflow apparatus of FIG. 1.

FIG. 4 is a perspective view illustrating an article supported on the substrate stage of FIG. 3.

FIG. 5 is a cross-sectional view illustrating solder balls reflowed on a substrate supported on the substrate stage of FIG. 1 by a vapor phase reflow method.

FIG. 6 is a cross-sectional view illustrating a portion of an airflow control cover disposed on the substrate of FIG. 5 to cover the solder balls.

FIG. 8 is a cross-sectional view illustrating a portion of an airflow control cover disposed to cover the solder balls on the substrate of FIG. 5 according to another embodiment.

FIG. 10 is a flowchart illustrating a method of manufacturing an electronic device in accordance with example embodiments.

FIGS. 11 to 19 are views illustrating a method of manufacturing an electronic device in accordance with example embodiments.

DETAILED DESCRIPTION

Hereinafter, example embodiments will be explained in detail with reference to the accompanying drawings.

Figure 1:
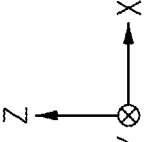
Figure 2:
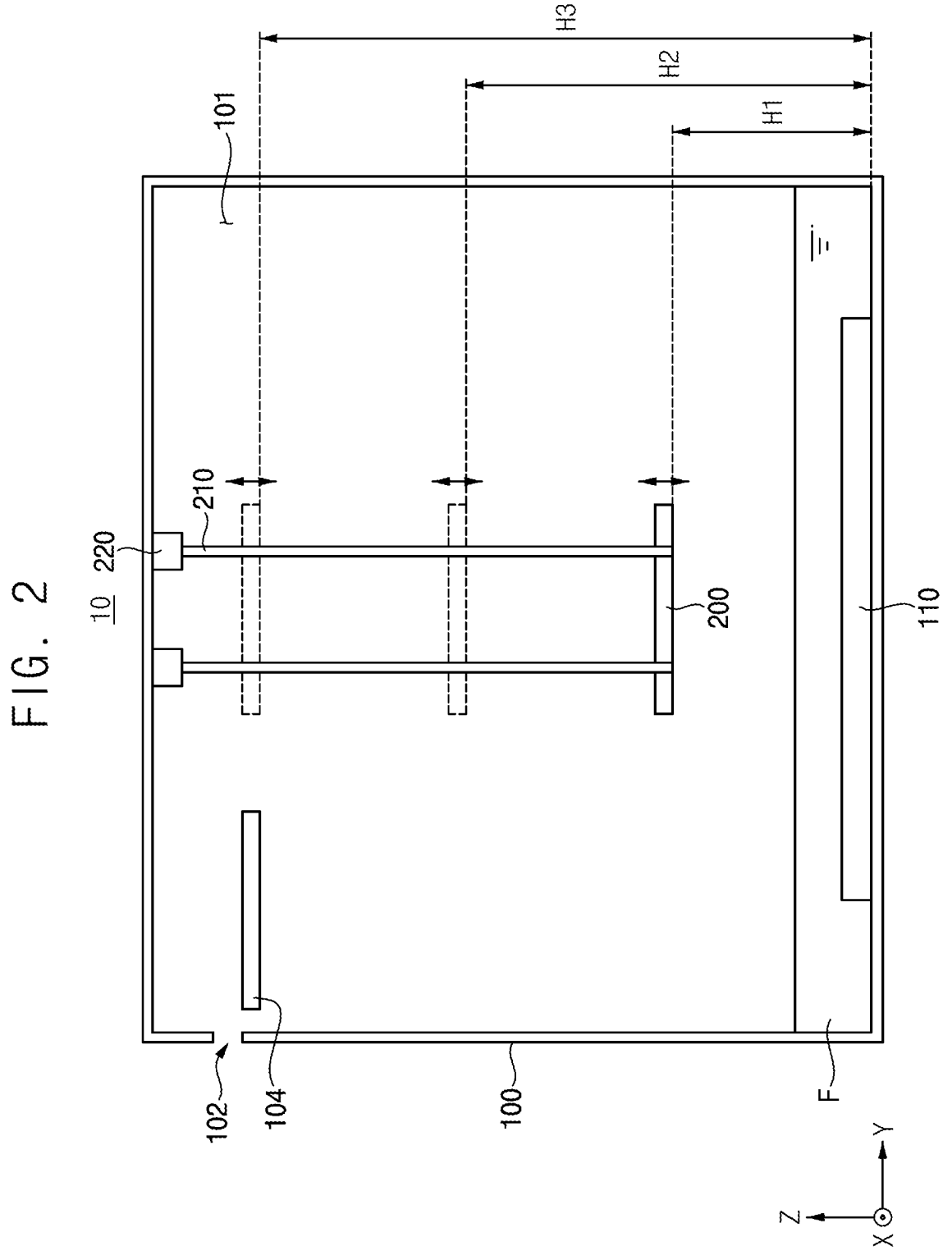
Figure 3:
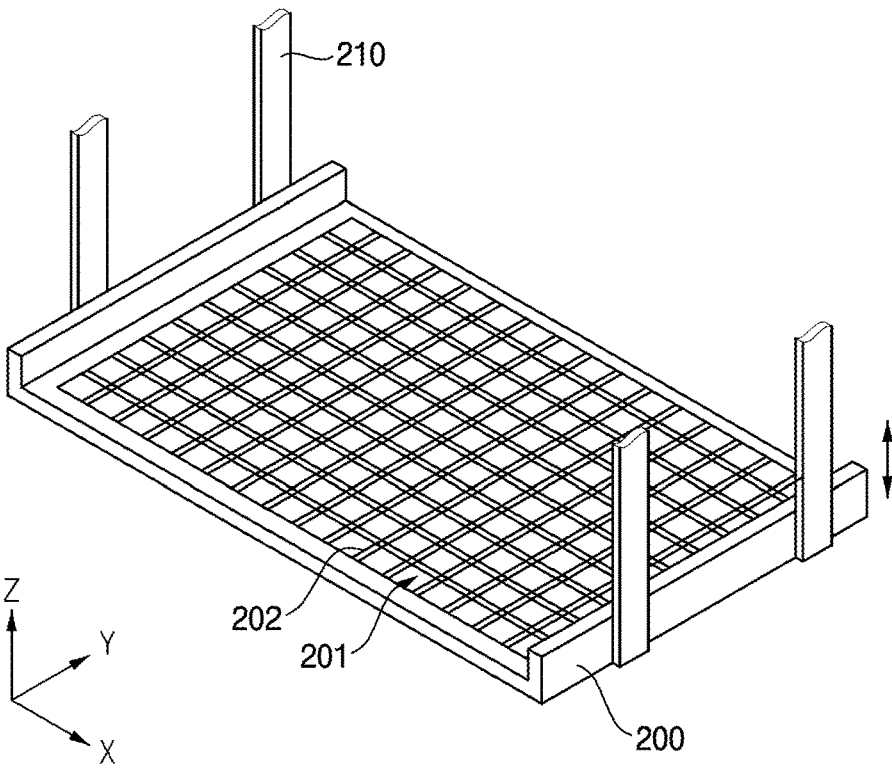
Figure 4:
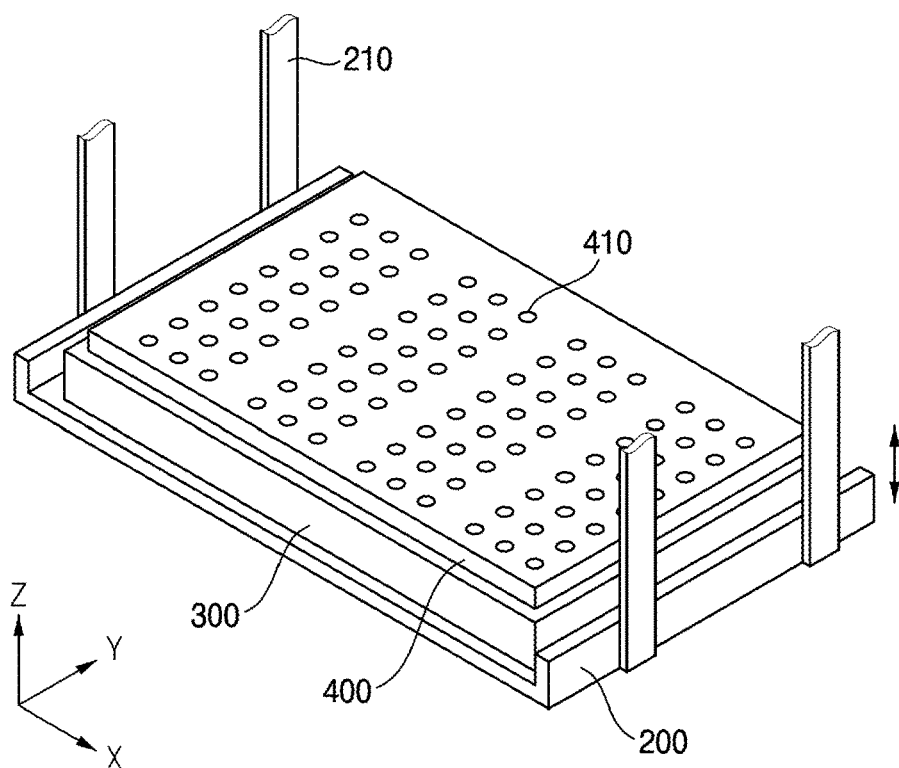

FIG. 1 is a cross-sectional view illustrating a solder reflow apparatus in accordance with example embodiments. FIG. 2 is a side view illustrating the solder reflow apparatus of FIG. 1. FIG. 3 is a perspective view illustrating a substrate stage of the solder reflow apparatus of FIG. 1. FIG. 4 is a perspective view illustrating an article supported on the substrate stage of FIG. 3.

Referring to FIGS. 1 to 4, a solder reflow apparatus 10 may include a vapor generating chamber 100, a heater 110 and a substrate stage 200. In addition, the solder reflow apparatus 10 may further include a lifting driver 220 configured to raise and lower the substrate stage 200, a temperature sensing portion or temperature sensor configured to monitor temperature in the vapor generating chamber 100, etc.

In example embodiments, the solder reflow apparatus 10 may be a vapor phase soldering apparatus configured to solder a solder paste by saturated vapor heated in the vapor generating chamber 100.

The vapor generating chamber 100 may include a lower reservoir having an oven shape to accommodate a heat transfer fluid F and to provide a space 101 filled with vapor that is generated directly above the fluid when the fluid F is boiling. The vapor generating chamber 100 may extend in a vertical direction (Z direction) by a predetermined height. In the vapor generating chamber 100, the heat transfer fluid may boil and the vapor may rise to the top, may condense back to the liquid state at the top, and may flow back to the reservoir at the bottom.

The pressure inside the vapor generating chamber 100 may be maintained at atmospheric pressure. Alternatively, the vapor generating chamber 100 may be connected to an exhaust device such as a vacuum pump to adjust the pressure inside the vapor generating chamber 100. The pressure inside the vapor generating chamber may be maintained at a predetermined pressure in order to change the boiling point of the heat transfer fluid or soldering environments.

The heat transfer fluid F may be or include a chemical material that is selected to provide the vapor necessary for vapor phase soldering. The heat transfer fluid may be selected in consideration of boiling point, environmental influences, and corrosiveness of the generated vapor. The heat transfer fluid may include an inert organic liquid. For example, the heat transfer fluid may include a perfluoropolyether (PFPEs)-based Galden® solution. The boiling point of the Galden® solution may be 230° C.

The heater 110 may heat the heat transfer fluid F accommodated in the vapor generating chamber 100 to generate saturated vapors. The heater 110 may include an electrical resistor that is immersed in the heat transfer fluid F on the bottom of the vapor generating chamber 100. Alternatively, the heater 110 may include a resistor in the form of a coil surrounding the reservoir tank.

In addition, a heater as a portion of a temperature control mechanism may be installed on a sidewall of the vapor generating chamber 100 to control the temperature of the vapor generating chamber 100 during a reflow process.

As illustrated in FIGS. 3 and 4, the substrate stage 200 may support an article S (see, e.g., FIG. 5) on which a solder process is performed in the vapor generating chamber 100. The substrate stage 200 may include a support structure for supporting the article S. The support structure may have a mesh shape or may have a plurality of vapor passage holes. The mesh type support structure may include support wires 202 that define a plurality of openings 201 through which the vapor moves. For example, the article S may include a substrate 20 to which solder members such as solder balls 70 are attached to one surface. The substrate 20 may be a printed circuit board (PCB) strip in which a plurality of PCBs are integrally provided. The substrate 20 may not be limited to the PCB strip, and may be an individual PCB of a package unit or a wafer or die separated into individual units through a sawing process. The openings 201 may have circular or polygonal shapes. The sizes and shapes of the openings 201, thicknesses of support wires, etc. may be determined in consideration of the temperature profile in the vapor generating chamber.

The substrate stage 200 may be installed to be movable upward and downward within the vapor generating chamber 100. The lifting driver for moving the substrate stage 200 upward and downward may include various types of actuators such as a transfer rail, a transfer screw, a transfer belt, etc. Both end portions of the substrate stage 200 may be supported by transfer rods 210 respectively, and the substrate stage 200 may be moved up and down by the lifting driver.

As illustrated in FIG. 2, the article S for soldering may be transferred into the vapor generating chamber 100 through a gate 102 of the vapor generating chamber 100, and the article S may be loaded on the substrate stage 200 by a transfer mechanism 104 such as a guide rail or a transport pusher.

After the article S is loaded, the Galden® solution F may be heated by the heater 110 and start to boil. The saturated vapor from the Galden® solution may be distributed within the space 101 of the vapor generating chamber 100. At this time, the density of the saturated vapor may vary depending on the height, and thus a temperature gradient may be formed.

For example, the temperature T1 of the vapor generating chamber at a third height H3 may be 100° C., the temperature T2 of the vapor generating chamber at a second height H2 may be 170° C., and the temperature T3 of the vapor generating chamber at a first height H1 may be 230° C. The solder ball 70 may include Sn—Ag—Cu (SAC) solder, Sn—Ag solder, etc. Since the boiling point of the SAC solder is 217° C., the temperature T3 at the first height H1, which is a reflow section, may be maintained at 230° C.

Hereinafter, a method of performing a vapor phase reflow process using the solder reflow apparatus of FIG. 1 will be described.

Figure 5:
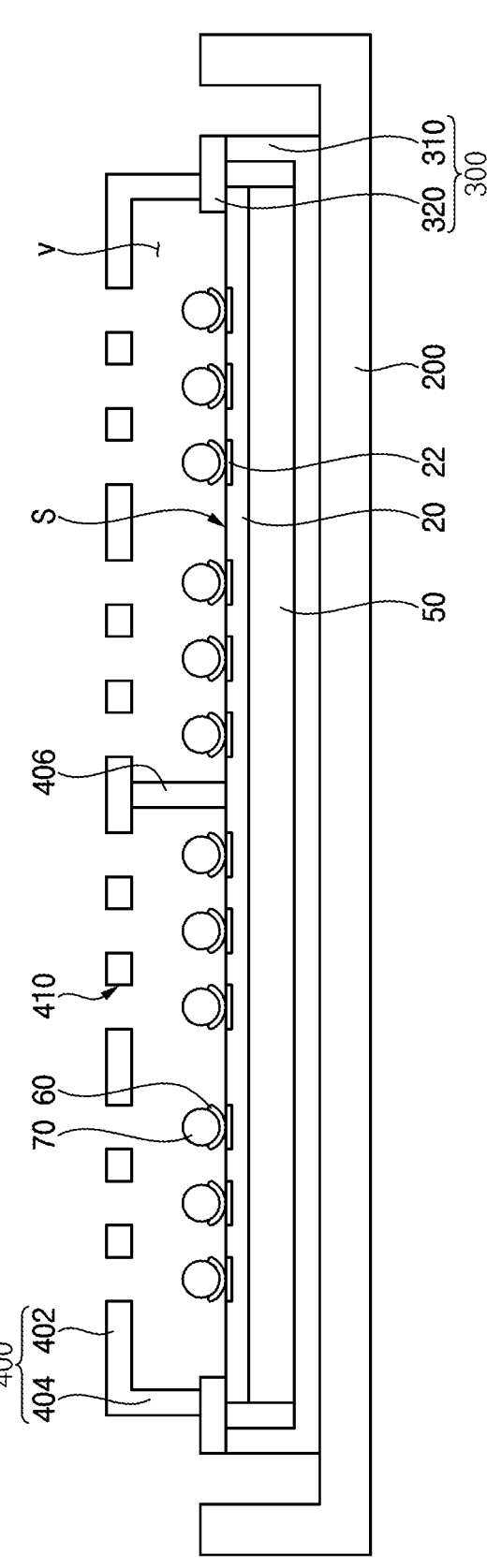
Figure 6:
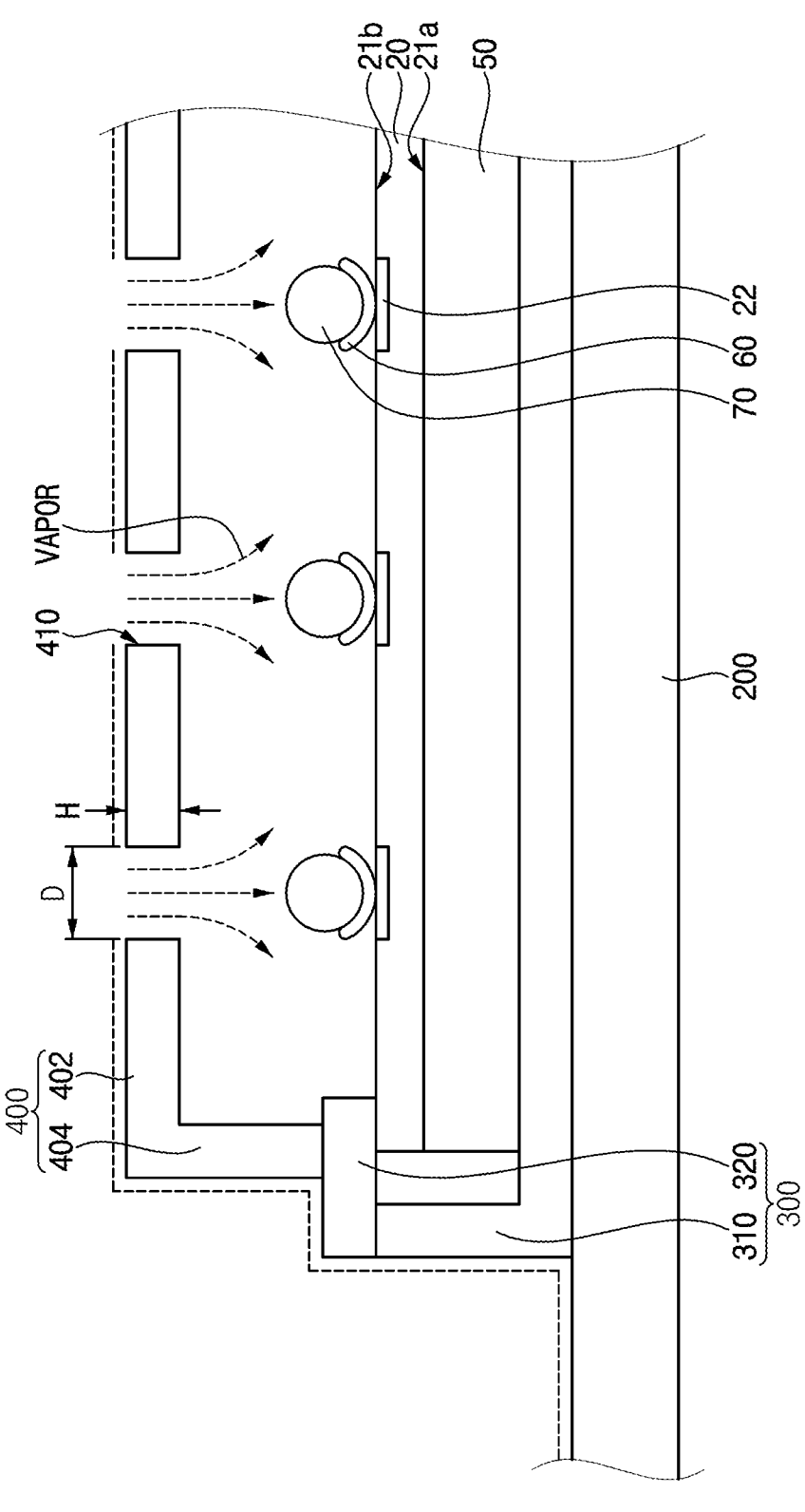
Figure 7A:
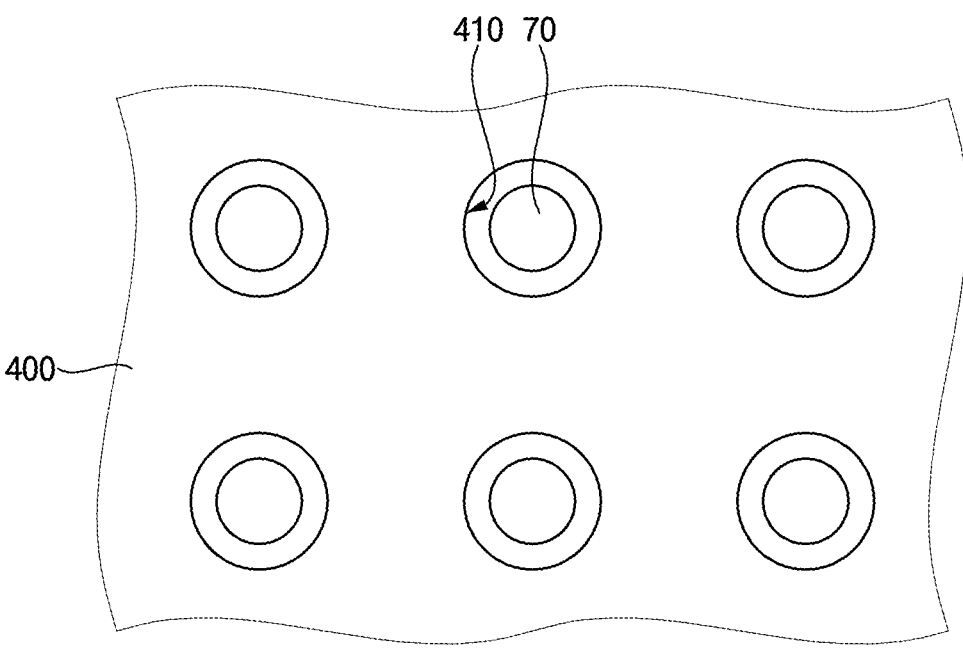
FIG. 7A is a plan view illustrating a portion of the airflow control cover of FIG. 6.
Figure 7B:
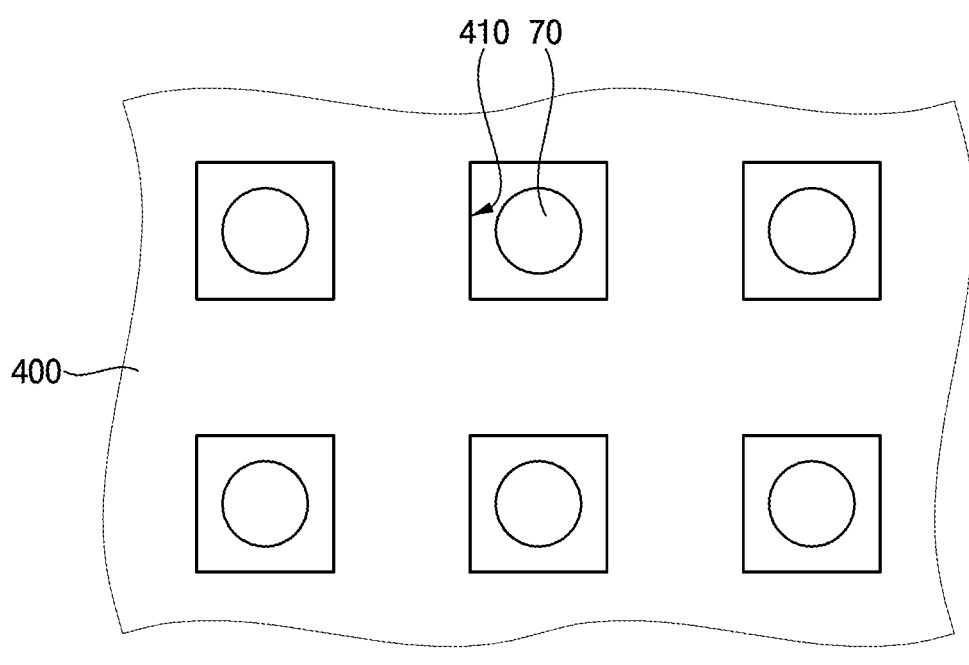
FIGS. 7B to 7D are plan views illustrating airflow control covers having vapor passage holes of various shapes.
Figure 7C:
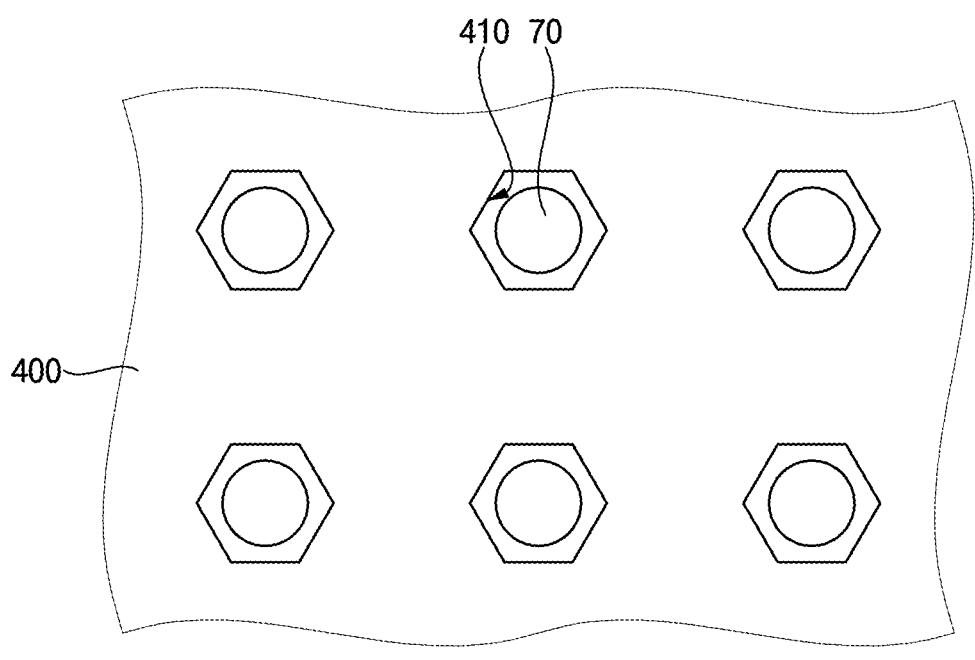
Figure 7D:
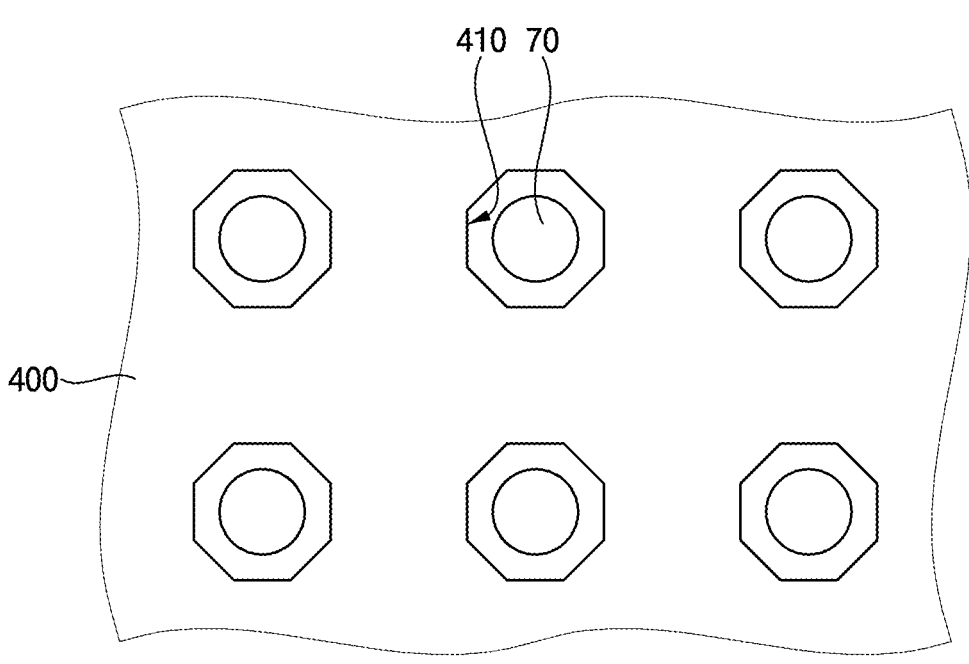

FIG. 5 is a cross-sectional view illustrating solder balls reflowed on a substrate supported on the substrate stage of FIG. 1 by a vapor phase reflow method. FIG. 6 is a cross-sectional view illustrating a portion of an airflow control cover disposed on the substrate of FIG. 5 to cover the solder balls. FIG. 7A is a plan view illustrating a portion of the airflow control cover of FIG. 6. FIGS. 7B to 7D are plan views illustrating airflow control covers having vapor passage holes of various shapes.

Referring to FIGS. 5 and 6, first, an article S for soldering may be loaded into the vapor generating chamber 100, and the heat transfer fluid F in the vapor generating chamber 100 may be heated.

In example embodiments, after a semiconductor chip is mounted on a first surface 21a of the substrate 20 and a molding member 50 is formed to mold the semiconductor chip, a solder paste 60 and solder balls 70 may be attached onto bonding pads 22 as ball lands provided on a second surface 21b opposite to the first surface 21a of the substrate 20. The substrate 20 to which the solder balls 70 are attached may be transferred into the vapor generating chamber 100 through the gate 102 of the vapor generating chamber 100, and then, the article S may be loaded on the substrate stage 200 by the transfer mechanism 104 such as a guide rail or a transfer pusher.

As illustrated in FIGS. 5 and 6, an airflow control cover 400 may be disposed on or over the second surface 21b of the substrate 20 supported on the substrate stage 200 and may cover the solder balls 70 attached to the bonding pads 22. For example, the substrate 20 to which the solder balls 70 are attached may be fixed on a fixing jig 300, and the fixing jig 300 on which the substrate 20 is fixed may be seated on the substrate stage 200 in the vapor generating chamber 100.

The fixing jig 300 may press and fix the substrate 20 of the article S. In a state in which the substrate 20 is pressurized and fixed, the fixing jig 300 may be supported on a seating surface of the substrate stage 200. The fixing jig 300 may include a lower jig 310 and an upper jig 320 disposed on the lower jig 310. The lower jig 310 may include a lower base plate on which the substrate 20 is seated. The upper jig 320 may be disposed on the lower jig 310 to press the substrate 20. The upper jig 320 and the lower jig 310 may be coupled to each other by a fixing member such as a magnetic material. The upper jig 320 may include an edge portion that presses a peripheral region of the substrate 20 and forms a window that exposes the solder balls 70 on the substrate 20.

In example embodiments, the airflow control cover 400 may include a cover plate 402 extending parallel to the second surface 21b of the substrate 20 above the solder balls 70 and a support portion or support 404 extending from the fixing jig 300 to support the cover plate 402. The cover plate 402 and the support portion 404 may form an enclosed or partially enclosed space V where a desired airflow is generated. For example, the cover plate 402 may have a rectangular plate shape, and the support portion 404 may include first to fourth support plates vertically extending from first to fourth side portions of the cover plate 402. The support portion 404 may extend upward from the edge portion of the upper jig 320. The support portion 404 may be detachably fastened to the upper jig 320 by a fastening member such as hook and loop fastener or Velcro®.

Alternatively, the airflow control cover 400 may be supported on the second surface 21b of the substrate 20. The support portion 404 of the airflow control cover 400 may be detachably fastened to the peripheral region of the second surface 21b of the substrate 20.

The airflow control cover 400 may further include an auxiliary support portion or auxiliary support 406 for supporting the cover plate 402. The auxiliary support portion 406 may include at least one auxiliary support plate that extends vertically from a central region of a lower surface of the cover plate 402. The auxiliary support plate may be detachably fastened to the central region of the second surface 21b of the substrate 20. The auxiliary support plate may extend upward from a central region of the second surface 21b of the substrate 20 to support the cover plate 402.

The airflow control cover 400 may include a material having durability. For example, the airflow control cover 400 may include a metal such as stainless steel or ceramic, but is not limited thereto. A thickness H of the airflow control cover 400 or the cover plate 402 thereof may be within a range of 10% to 500% of a thickness of the substrate 20.

As illustrated in FIG. 6, the airflow control cover 400 may have vapor passage holes 410 corresponding to or vertically overlapping the solder balls 70. The vapor passage holes 410 of the airflow control cover 400 may form an air flow in which the heat transfer fluid in the vapor state in the vapor generating chamber 100 moves toward the solder balls 70 under the airflow control cover 400. The vapor passage holes 410 of the airflow control cover 400 may form an air flow that maintains the solder balls 70 fixedly during reflow. For example, the vapor passage hole 410 may have an aspect ratio (H/D) smaller than 1. The vapor passage hole 410 may have a circular or polygonal shape. Additionally, a size (e.g., diameter) of the vapor passage hole 410 may be equal to or greater than a size (e.g., diameter) of the corresponding solder ball 70.

As illustrated in FIG. 7A, when viewed from a plan view, the vapor passage holes 410 may be arranged to overlap the solder balls 70 respectively. The vapor passage hole 410 may have a circular shape. The heat transfer fluid in the vapor state that has passed through the vapor passage hole 410 may exert a drag force that presses an upper surface of the solder ball 70 positioned below. The position of the solder ball 70 may be maintained fixedly by this drag force. The heat transfer fluid in the vapor state that has passed through the vapor passage hole 410 may make contact with the surface of the solder ball 70 and the surface of the substrate 20 and may be condensed, thereby bonding the solder ball 70 to the bonding pad 22.

As illustrated in FIGS. 7B to 7D, for example, the vapor passage hole 410 may have a polygonal shape such as a quadrangle, a hexagon, or an octagon. The vapor passage hole 410 may have various shapes to control the flow of air toward the solder ball 70 positioned below.

In particular, after the fixing jig 300 in which the substrate 20 having the solder balls 70 attached thereon is fixedly supported and on which the airflow control cover 400 is disposed is loaded into the vapor generating chamber 100, the Galden® solution F may be heated by the heater 110 and start to boil. The saturated vapor from the Galden® solution may be distributed within the space 101 of the vapor generating chamber 100. At this time, the vapor may have a density gradient according to the height, and thus, a temperature gradient along the vertical direction within the vapor generating chamber 100 may be formed.

After the substrate 20 is preheated at the third height H3, the substrate may be moved to the second height H2 and activated (soaked). The substrate 20 may be preheated to prevent various soldering defects and to provide a more solid and conductive joint. There may be a secondary vapor phase which is produced at a cooler temperature than the main vapor layer at the third and second heights H3 and H2. No soldering takes place in this zone, only a temperature rises.

The substrate 20 may be moved to the first height H1 so that the solder balls 70 may be reflowed. When the substrate 20 is immersed in the vapor at the first height H1, the vapor may serve as a heat transfer medium. Since the temperature of the vapor and the temperature of the substrate 20 at the first height H1 are different from each other, the vapor may pass through the vapor passage holes 410 of the airflow control cover 400 to reach the solder balls 70 and the surface of the substrate 20 and may be condensed to form a layer. The vapor condensing on the surface may transfer latent heat to the solder balls 70 and the second surface 21*b* of the substrate 20 to reflow the solder paste 60 to solder the solder balls 70. At this time, the heat transfer fluid in the vapor state that has passed through the vapor passage holes 410 of the airflow control cover 400 may exert the drag force to press the upper surface of the solder ball 70 to thereby maintain the position of the solder ball 70 fixedly.

Accordingly, the airflow control cover 400 may control the airflow directed to the solder balls 70 without directly contacting the solder balls 70 to prevent the solder balls 70 from moving when the solder balls 70 are reflowed. Thus, when the solder balls are reflowed by the vapor phase soldering method, solder ball mounting defects due to misalignment of the solder balls may be prevented.

Then, after the solder balls 70 are soldered, the substrate 20 may move to the top of the chamber and then may be cooled. Accordingly, the solder joints may be cooled down and solidified.

Figure 8:
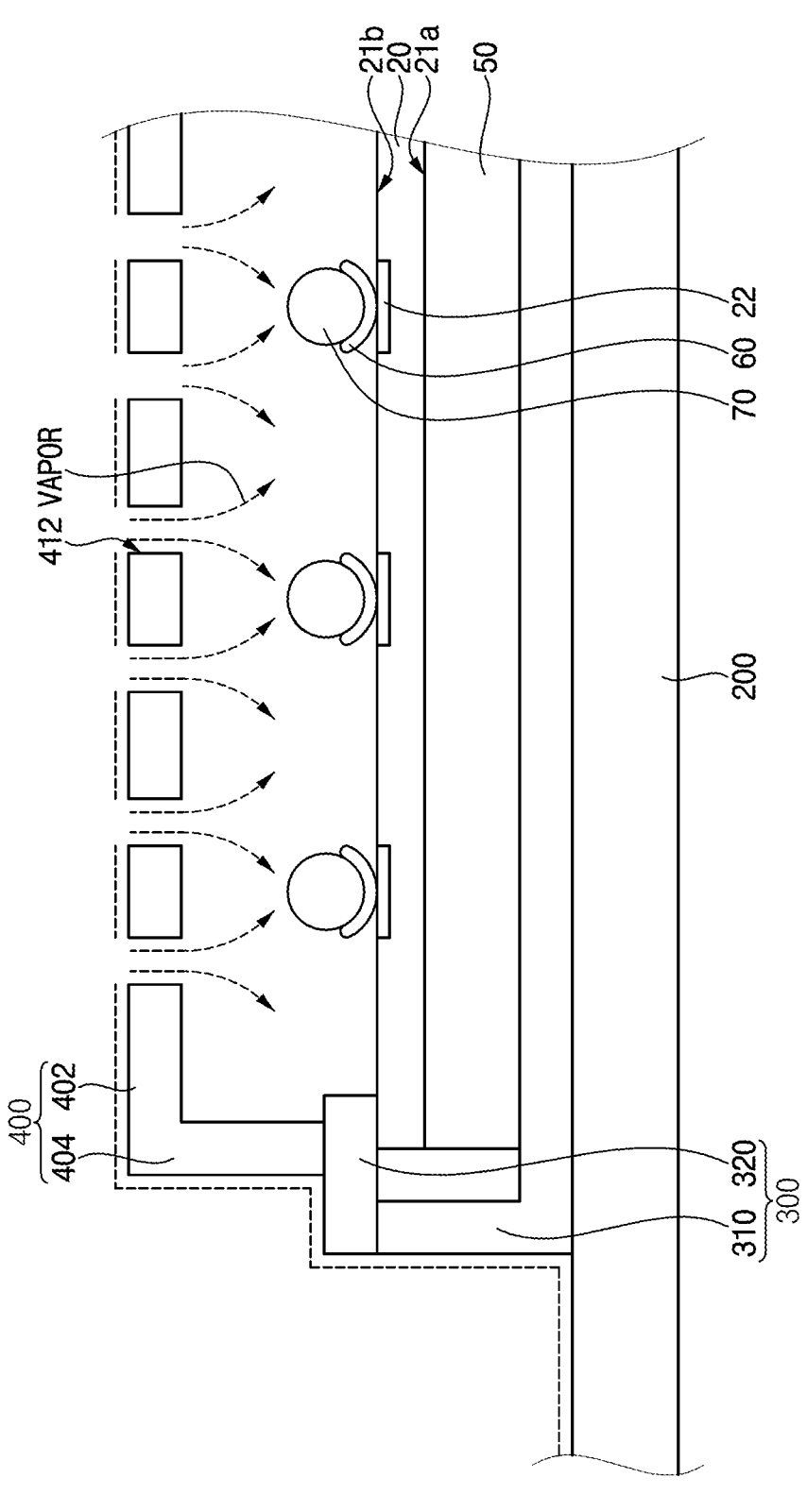
Figure 9A:
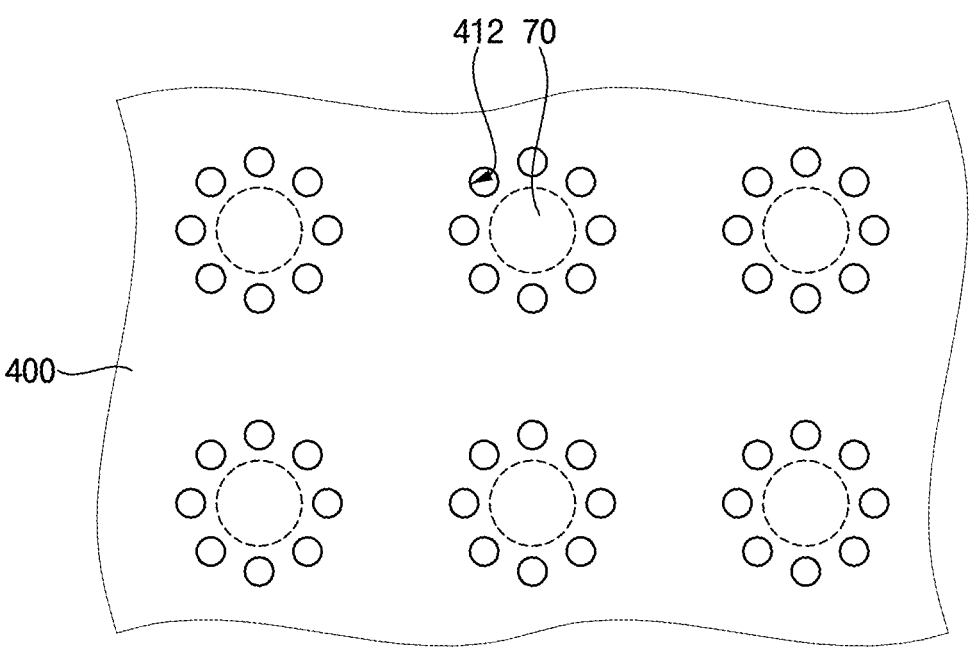
FIG. 9A is a plan view illustrating a portion of the airflow control cover of FIG. 8.
Figure 9B:
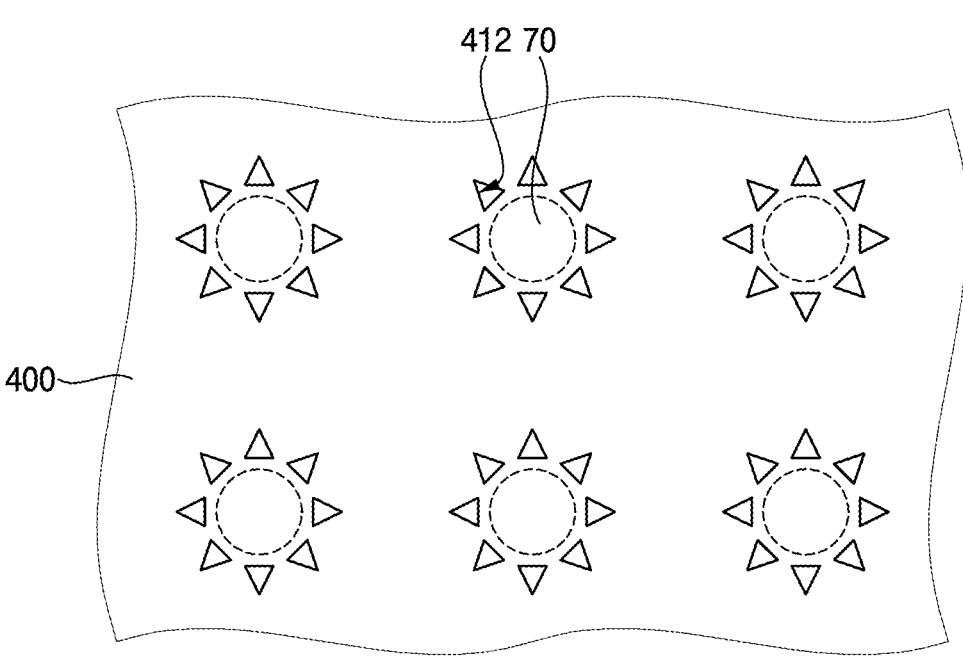
FIGS. 9B to 9D are plan views illustrating airflow control covers having vapor passage holes of various shapes.
Figure 9C:
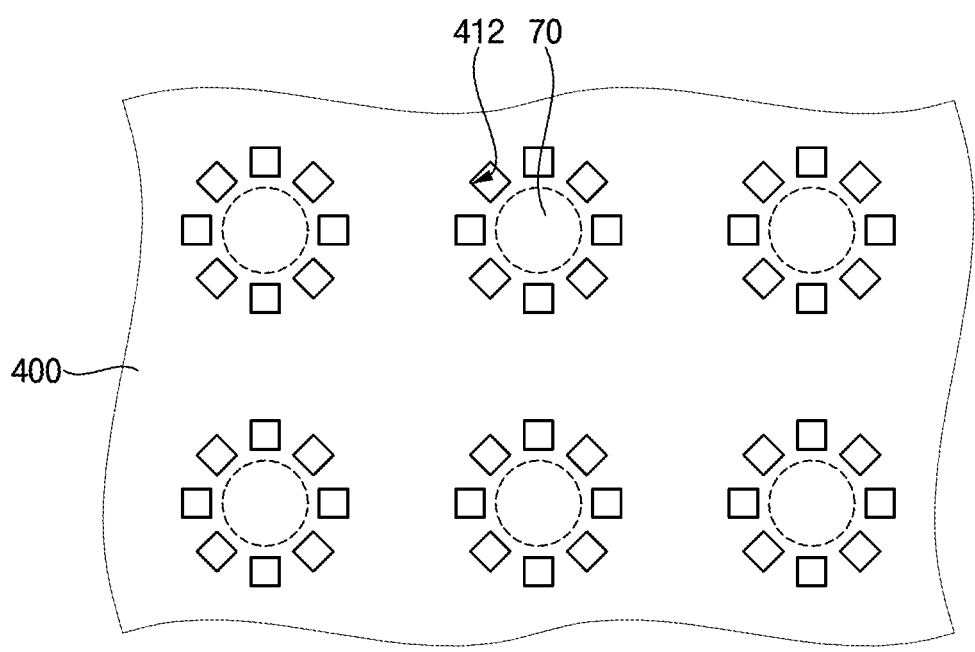
Figure 9D:
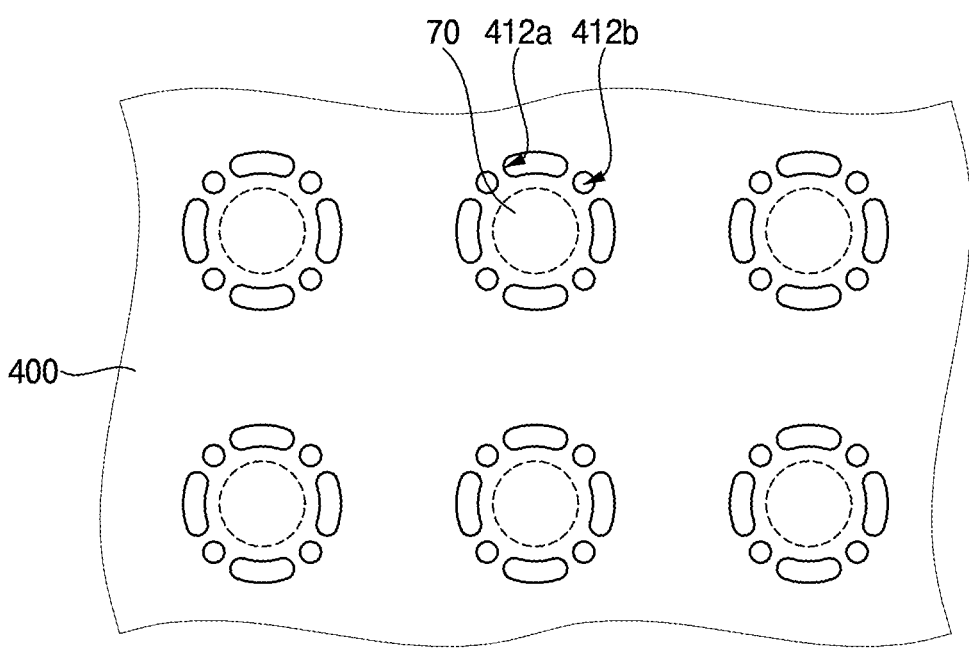

FIG. 8 is a cross-sectional view illustrating a portion of an airflow control cover disposed to cover the solder balls on the substrate of FIG. 5 according to another embodiment. FIG. 9A is a plan view illustrating a portion of the airflow control cover of FIG. 8. FIGS. 9B to 9D are plan views illustrating airflow control covers having vapor passage holes of various shapes.

Referring to FIGS. 8 and 9A, an airflow control cover 400 may have a plurality of vapor passage holes 412 corresponding to one solder member 70. When viewed from a plan view, the plurality of vapor passage holes 412 may be spaced apart from each other along a circumference of one solder ball 70. The vapor passage hole 412 may have a circular shape. A heat transfer fluid in a vapor state that has passed through the plurality of vapor passage holes 412 may generate a drag force that presses around an upper surface of the corresponding solder ball 70 positioned below. The position of the solder ball 70 may be maintained fixedly by this drag force. The heat transfer fluid in the vapor state that has passed through the plurality of vapor passage holes 410 may make contact with the surface of the solder ball 70 and the surface of the substrate 20 and may be condensed, thereby bonding the solder ball 70 to the bonding pad 22.

Referring to FIGS. 9B and 9C, a vapor passage hole 412 may have a triangular or quadrangular shape. The vapor passage hole 412 may have various shapes to control the flow of air toward the solder ball 70 positioned below.

Referring to FIG. 9D, a plurality of vapor passage holes may include a first group of vapor passage holes 412*a* and a second group of vapor passage holes 412*b*. The first and second groups of the vapor passage holes 412*a* and 412*b* may be arranged to be spaced apart from each other in a circumferential direction. The first and second groups of the vapor passage holes 412*a* and 412*b* may have different shapes. For example, the first group of vapor passage holes 412*a* may have an arc shape, and the second group of vapor passage holes 412*b* may have a circular or polygonal shape. Additionally, the first and second groups of the vapor passage holes 412*a* and 412*b* may have different sizes. For example, the first group of the vapor passage holes 412*a* may have a first size, and the second group of the vapor passage holes 412*b* may have a second size smaller than the first size. However, it may be understood that the shapes and sizes of the first and second groups of the vapor passage holes are not limited thereto, and the first and second groups of the vapor passage holes may have various shapes and sizes to control the flow of air toward the corresponding solder ball 70.

In example embodiments, a plurality of airflow control covers may cover the solder balls 70 on the second surface 21*b* of the substrate 20. For example, three airflow control covers may be disposed on the second surface 21*b* of the substrate 20. The solder balls 70 may be grouped into first to third groups, a first airflow control cover may cover the first group of the solder balls 70, a second airflow control cover may cover the second group of the solder balls 70, and a third airflow control cover may cover the third group of solder balls 70.

In example embodiments, an airflow control cover may cover only some of the solder balls 70, and the remaining solder balls may be exposed by the airflow control cover.

Hereinafter, a method of manufacturing an electronic device using the solder reflow apparatus of FIG. 1 will be described. A case in which the electronic device is a semiconductor package will be described. However, it will be understood that the manufacturing method of the electronic device in accordance with example embodiments is not limited thereto.

Figure 10:
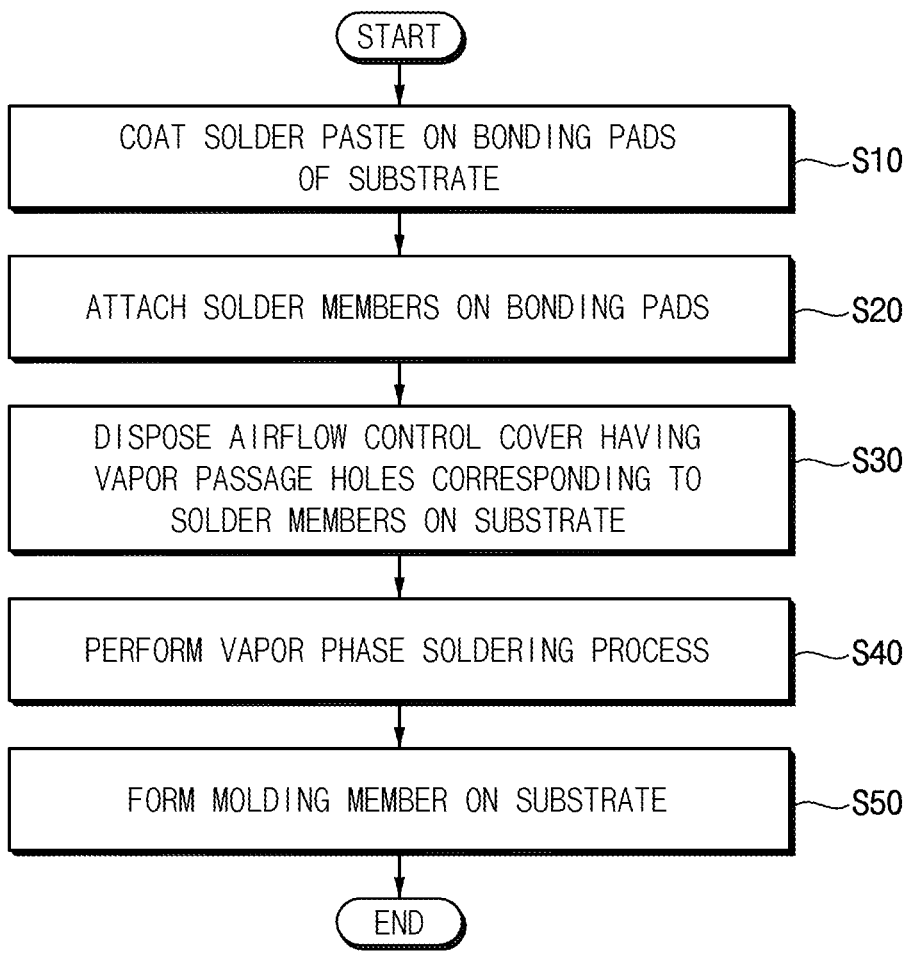
Figure 11:
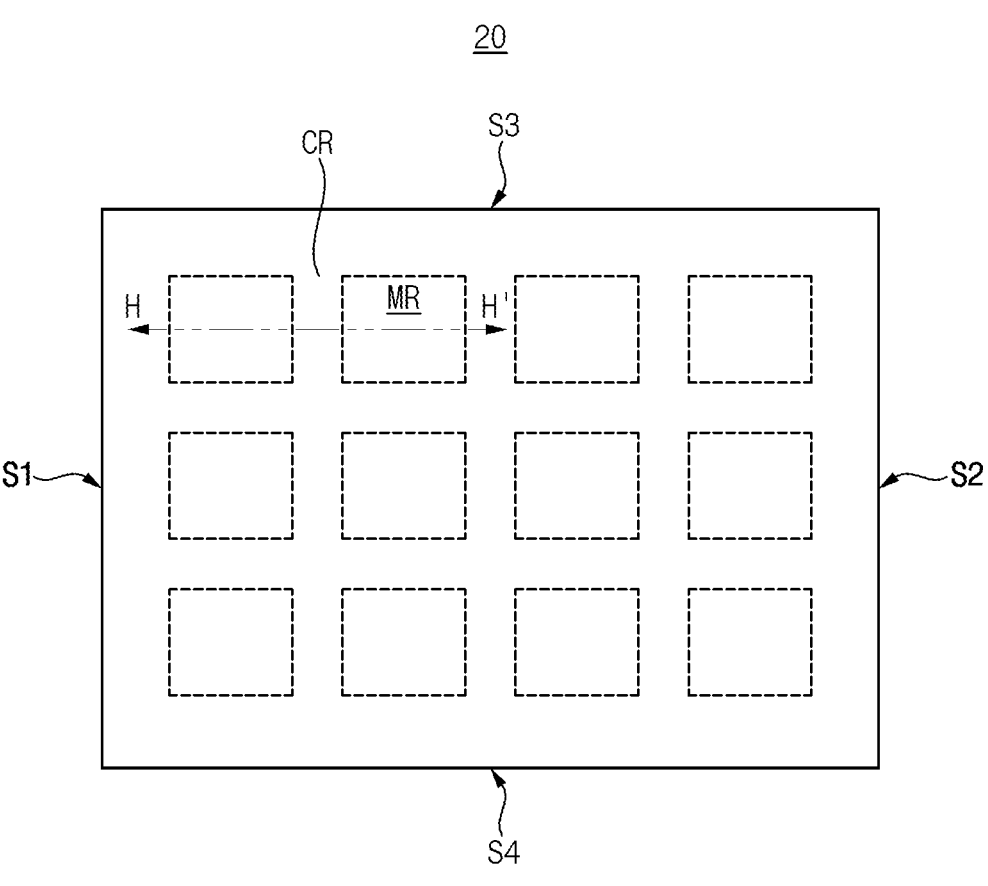
Figure 12:
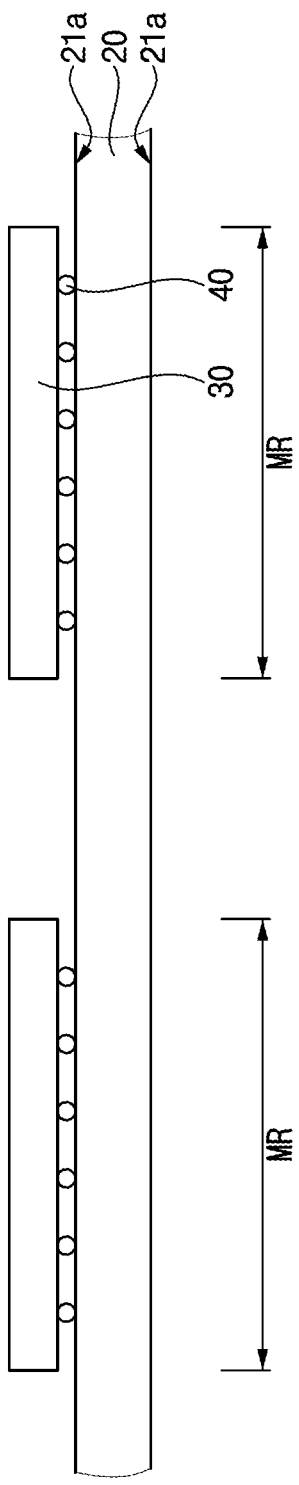
Figure 13:
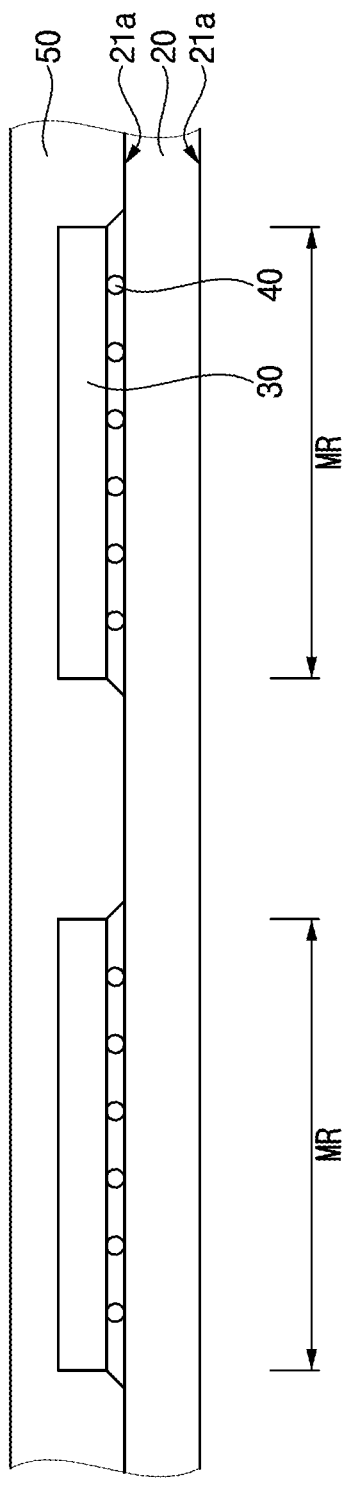

FIG. 10 is a flowchart illustrating a method of manufacturing an electronic device in accordance with example embodiments. FIGS. 11 to 19 are views illustrating a method of manufacturing an electronic device in accordance with example embodiments. FIG. 11 is a plan view illustrating a strip substrate on which semiconductor chips are mounted. FIGS. 12 and 13 are cross-sectional views taken along the line H-H' in FIG. 11.

Referring to FIGS. 10 to 13, first, a substrate 20 having a first surface 21*a* and a second surfaces 21*b* opposite to each other and having bonding pads 22 as ball lands formed thereon may be provided.

As illustrated in FIG. 11, the substrate 20 may be a multilayer circuit board as a package substrate. The substrate 20 may be a strip substrate for manufacturing a semiconductor strip such as a printed circuit board (PCB). Alternatively, the substrate 20 may be a semiconductor chip or an interposer.

The substrate 20 may have first and second side portions S1 and S2 extending in a direction parallel to a second direction (Y direction) parallel to the first surface 21*a* and facing or opposite each other, and third and fourth side portions S3 and S4 extending in a direction parallel to a first direction (X direction) perpendicular to the second direction and facing or opposite each other. When viewed from a plan view, the substrate 20 may have a quadrangular shape. The substrate 20 may have a predetermined area (eg, 77.5 mm×240 mm).

The substrate 20 may include a mounting region MR on which at least one electronic component is mounted and a cutting region CR surrounding the mounting region MR. A plurality of semiconductor chips as the electronic components may be disposed on the mounting regions MR of the substrate 20 respectively. For example, the semiconductor chip may include a logic semiconductor device and/or a memory device. The logic semiconductor device may be an application-specific integrated circuit (ASIC) as a host such as a CPU, GPU, or SoC. The memory device may include a high bandwidth memory (HBM) device. Alternatively, the electronic component may include a passive element such as a capacitor.

As illustrated in FIG. 12, tens to hundreds of semiconductor chips 30 may be arranged in a matrix form on the substrate 20. The semiconductor chips 30 may be respectively mounted on the first surface 21*a* of the substrate 20. For example, the semiconductor chips 30 may be mounted on the first surface 21*a* of the substrate 20 by a flip chip bonding method. The semiconductor chip 30 may be mounted on the first surface 21*a* of the substrate 20 via bumps 40. Alternatively, the semiconductor chip 30 may be attached to the first surface 21*a* of the substrate 20 by an adhesive film and electrically connected to the substrate 20 by bonding wires.

As illustrated in FIG. 13, a molding member 50 may be formed on the first surface 21*a* of the substrate 20 to cover the semiconductor chip 30. For example, the molding member 50 may be formed on the substrate 20 by a transfer molding apparatus. The substrate 20 may be disposed in a molding space of a mold of the molding apparatus, and a sealing material may be injected to flow at high temperature and high pressure in a state where a lower mold and an upper mold are clamped, so that the liquid sealing material flows inside the molding space and is solidified to form the molding member 50 covering the semiconductor chips 30. For example, the sealing material may include an epoxy mold compound (EMC).

Figure 14:
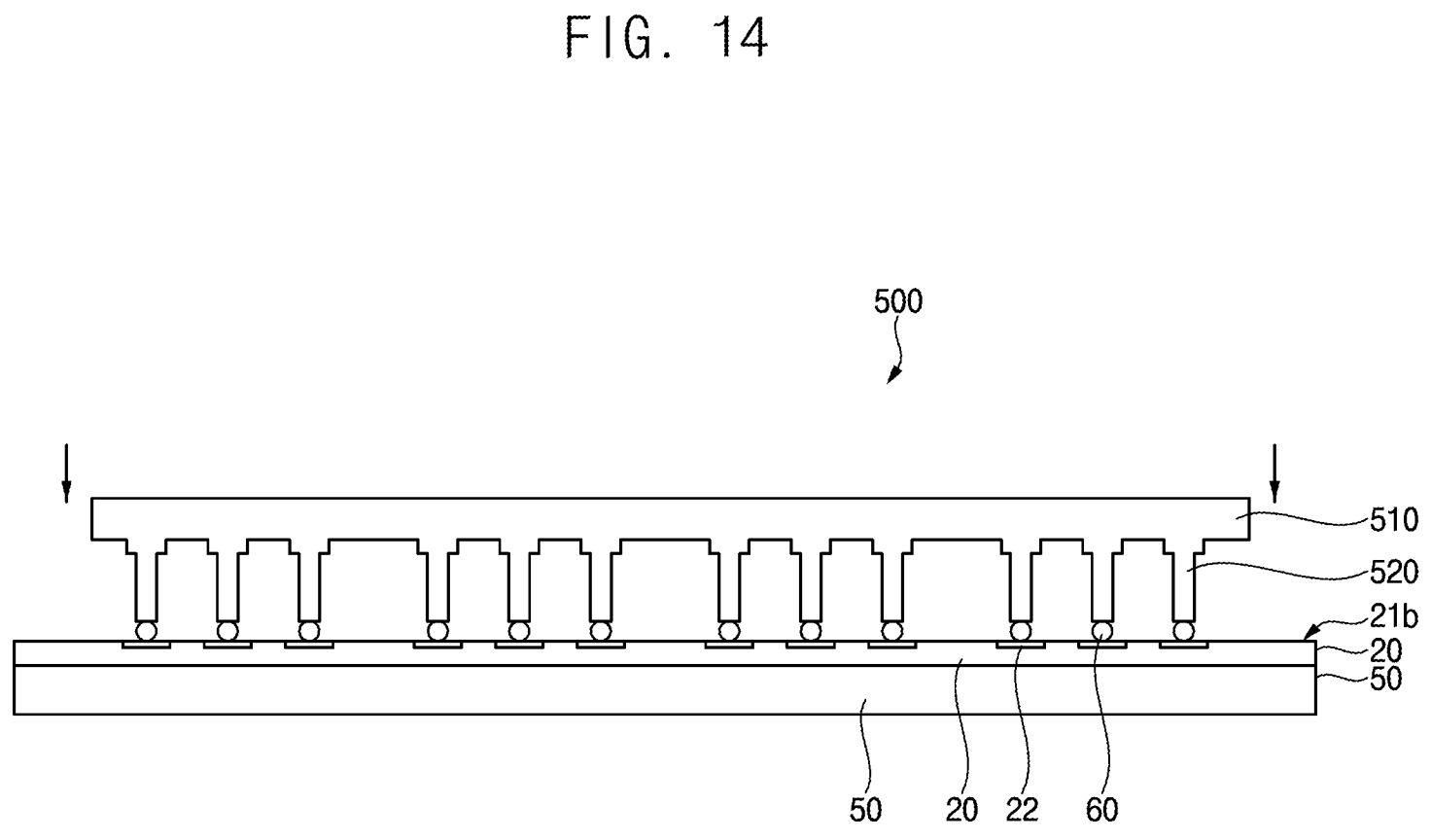

As illustrated in FIG. 14, a solder paste 60 may be coated on each of a plurality of bonding pads 22 on the second surface 21*b* of the substrate 20 (S10). A pitch or spacing between the bonding pads 22 of the substrate 20 may be within a range of several tens of microns.

For example, the substrate 20 may be transferred onto a stage of a flux coating apparatus 500, a body 510 of the flux coating apparatus 500 may be lowered onto the substrate 20 and dotting pins 520 of the flux coating apparatus 500 may dot the solder paste 60 on the bonding pads 22 of the substrate 20. The flux coating apparatus 500 may include the body 510 and a plurality of the dotting pins 520 extending from the body 510 in one direction. The dotting pins 520 may move to a flux reservoir, apply the solder paste 60 to ends of the dotting pins 520, and dot the solder paste 60 on the bonding pads 22 of the substrate 20. The solder paste 60 may include solder power and flux. The flux may include resin, solvent, activator, antioxidant, etc.

Alternatively, the solder paste 60 may be printed onto the bonding pads 22 of the substrate 20. For example, the solder paste 60 may be printed by a stencil printer. A stencil may be a metal foil having a plurality of openings corresponding to an array of solder balls to be subsequently placed. During printing, the solder paste 60 may be printed to fill openings of the stencil.

Figure 15:
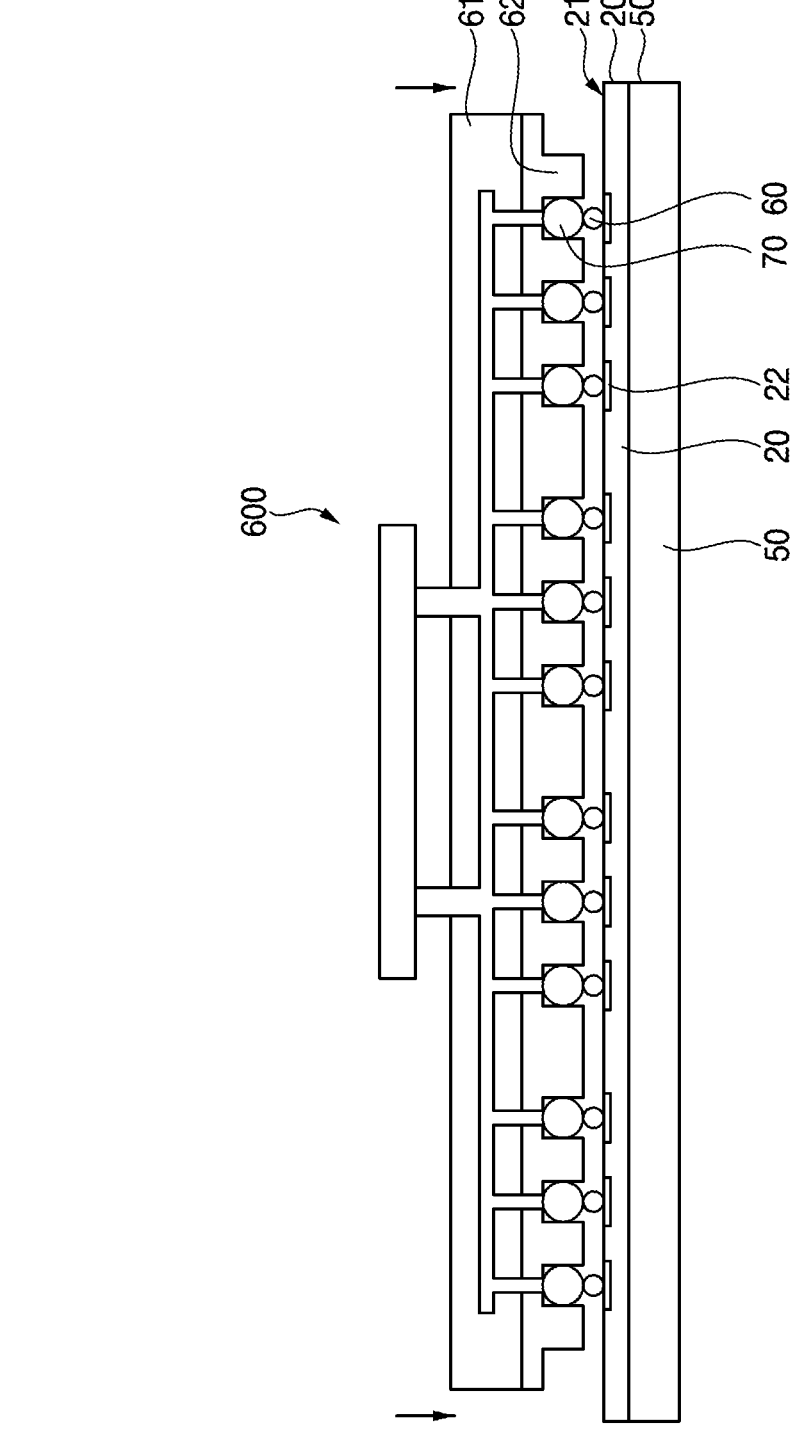
Figure 16:
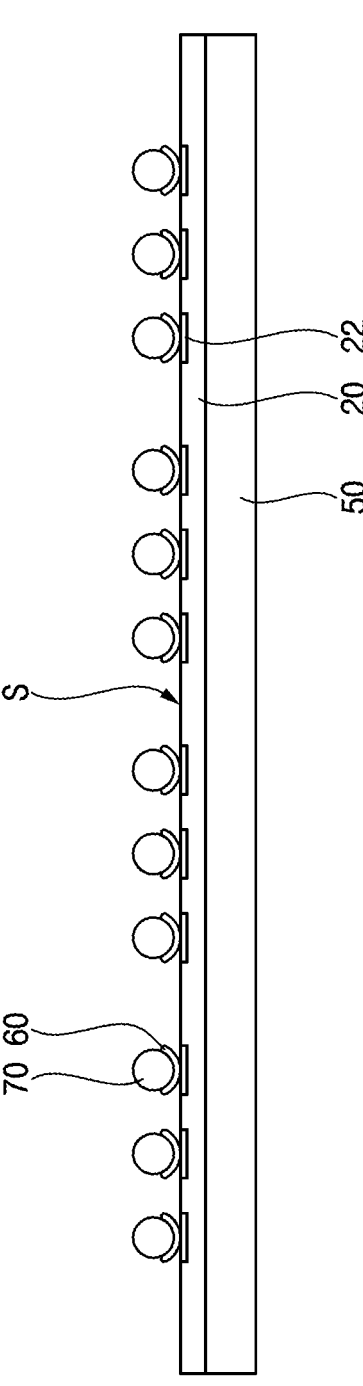

Referring to FIGS. 15 and 16, solder balls 70 as solder members may be attached to the bonding pads 22 to which the solder paste 60 is coated (S20).

For example, the substrate 20 may be transferred onto a stage of a solder member attachment apparatus 600, and the solder balls 70 adsorbed to suction holes of the solder member attachment apparatus 600 by a vacuum adsorption method may be attached to the bonding pads 22 of the substrate 20 respectively. The solder member attachment apparatus 600 may include a body 610 and a solder ball holding portion 620. The body 610 may include an internal space which is in communication with an external vacuum generating device, and the solder ball holding portion 620 may include a plurality of suction holes which are in communication with the internal space and selectively adsorbs the solder balls respectively. A vacuum may be applied to the suction holes to adsorb the solder balls 70, and the solder balls may be attached to the bonding pads 22 of the substrate 20 by removing the vacuum from the suction holes.

Accordingly, as illustrated in FIG. 16, an article S in which the solder paste 60 and the solder ball 70 are sequentially disposed on the bonding pad 22 of the substrate 20 may be provided.

Figure 17:
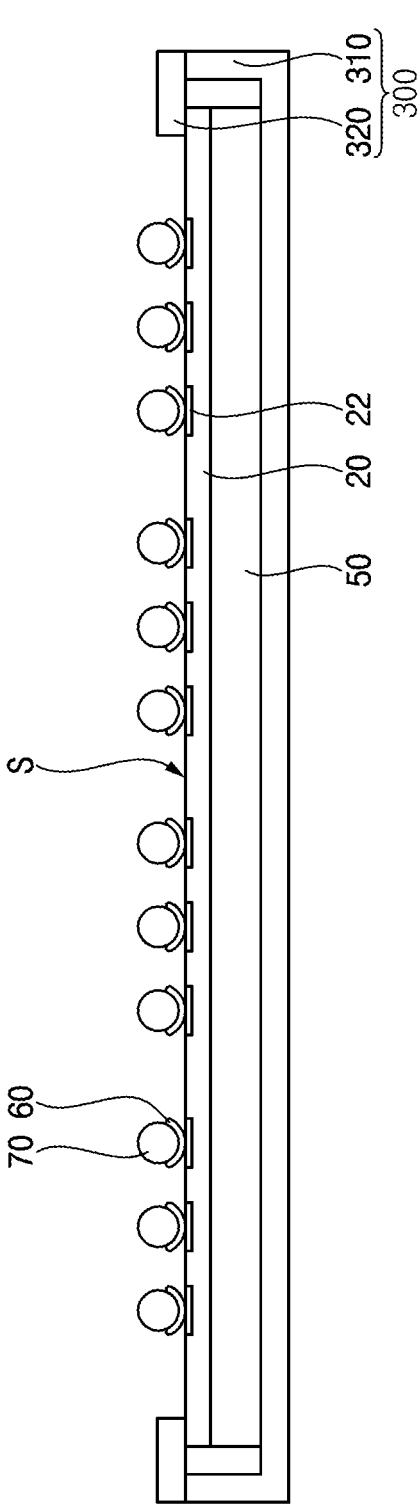
Figure 18:
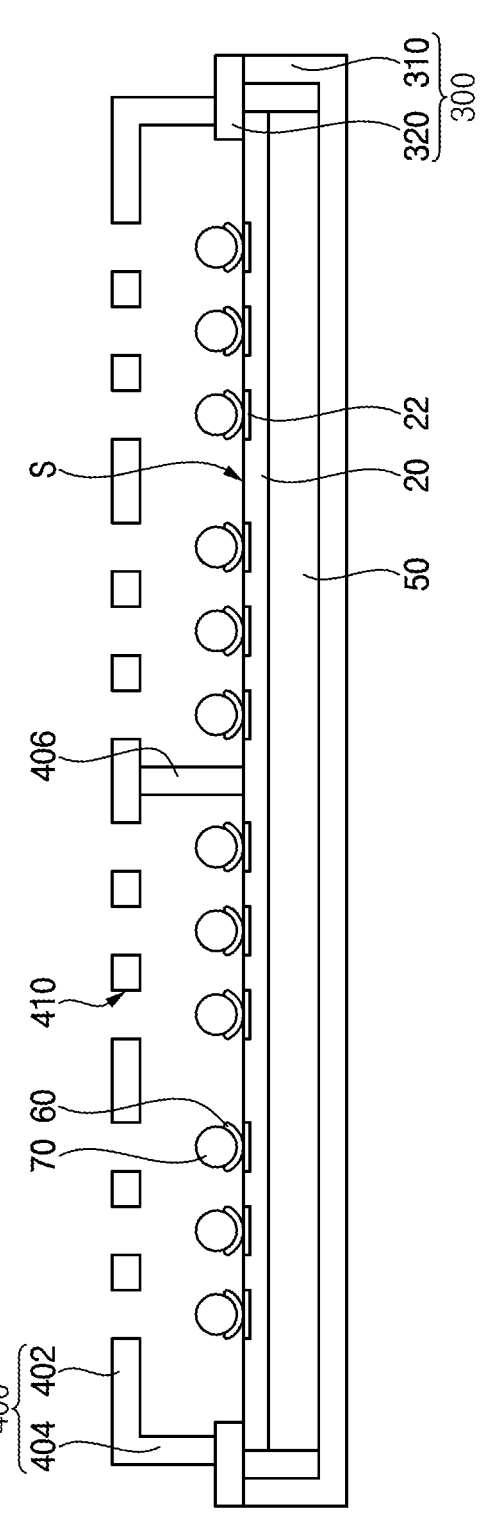
Figure 19:
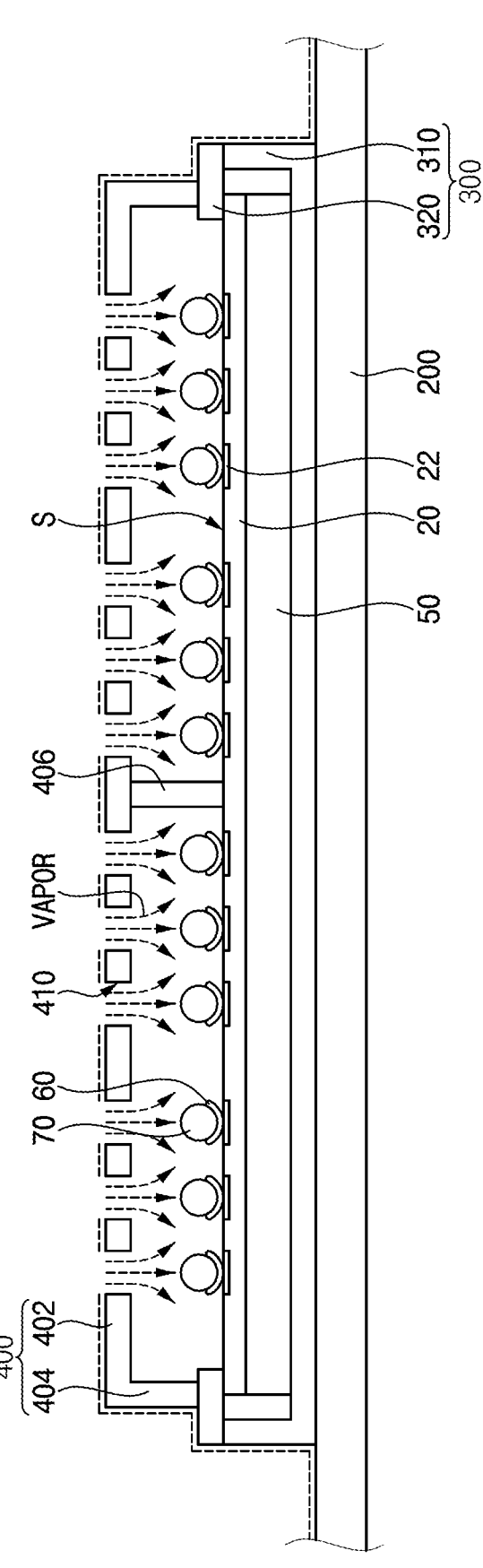

Referring to FIGS. 17 to 19, an airflow control cover 400 may be disposed or positioned on the substrate 20 to cover the solder balls 70 (S30), and soldering of the solder ball 70 may be performed using a vapor phase reflow method (S40).

In example embodiments, first, the substrate 20 may be disposed fixedly on a fixing jig 300 and the airflow control cover 400 may be disposed on the substrate 20.

As illustrated in FIG. 17, the substrate 20 to which the solder balls 70 are attached may be disposed on a lower jig 310 of the fixing jig 300, and an upper jig 320 may be disposed fixedly on the lower jig 310 to press the substrate 20. The upper jig 320 may include an edge portion that presses a peripheral region of the substrate 20 and forms a window that exposes the solder balls 70 on the substrate 20.

As illustrated in FIG. 18, the airflow control cover 400 may be disposed or positioned above the substrate 20 to cover the solder balls 70. The airflow control cover 400 may include a cover plate 402 extending parallel to the second surface 21*b* of the substrate 20 above the solder balls 70 and a support portion or support 404 extending from the fixing jig 300 to support the cover plate 402. The cover plate 402 and the support portion 404 may form an enclosed space V where a desired airflow is generated. The support portion 404 may be detachably fastened to the upper jig 320 by a fastening member such as Velcro.

As illustrated in FIG. 19, the fixing jig 300 in which the substrate 20 having the solder balls 70 attached thereon is fixedly supported and on which the airflow control cover 400 is disposed may be loaded into the vapor generating chamber 100 of the solder reflow apparatus 10 of FIG. 1, and while the substrate stage 200 is sequentially moved in the vertical direction within the vapor generating chamber 100, the heat transfer fluid in a vapor state may pass through the plurality of vapor passage holes 410 to be brought into contact with the surface of the solder ball 70 and the surface of the substrate 20 through an outer surface of the airflow control cover 400, thereby soldering the solder ball 70.

When the airflow control cover 400 is immersed in the vapor at the first height H1, the vapor may serve as a heat transfer medium. The vapor may move through the airflow control cover 400 to reach the solder balls 70 and the surface of the substrate 20 and may be condensed to form a layer. The vapor condensing on the surface may transfer latent heat to the solder balls 70 and the second surface 21b of the substrate 20 to reflow the solder paste 60 to solder the solder balls 70. At this time, the heat transfer fluid in the vapor state that has passed through the vapor passage holes 410 of the airflow control cover 400 may exert the drag force to press the upper surface of the solder ball 70 to thereby maintain the position of the solder ball 70 fixedly.

Accordingly, the airflow control cover 400 may control the airflow directed to the solder balls 70 without directly contacting the solder balls 70 to thereby prevent the solder balls 70 from moving when the solder balls 70 are reflowed. Thus, when the solder balls are reflowed by the vapor phase soldering method, solder ball mounting defects due to misalignment of the solder balls may be prevented.

Then, after the solder balls 70 are soldered, the substrate 20 may move to the top of the chamber and then may be cooled. Accordingly, the solder joints may be cooled down and solidified.

After the substrate 20 on which the solder balls 70 have been soldered is unloaded from the solder reflow apparatus 10 of FIG. 1, the airflow control cover 400 may be removed from the second surface 21b of the substrate 20. Then, a flux cleaning process may be performed to remove remaining flux.

Then, the substrate 20 and the molding member 50 may be sawed by a sawing process to complete individual semiconductor packages.

Through the above processes, a semiconductor package including a logic device or a memory device and a semiconductor module including the same may be manufactured. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A method of manufacturing an electronic device, the method comprising:
   providing a substrate including a plurality of bonding pads on a first surface of the substrate;
   attaching solder members on the plurality of bonding pads respectively;
   positioning an airflow control cover on the first surface of the substrate above the solder members, the airflow control cover including a plurality of vapor passage holes through which air is allowed to flow toward the solder members;

12 loading the substrate on which the airflow control cover is positioned into a vapor generating chamber that accommodates a heat transfer fluid therein;
   heating the heat transfer fluid to place the heat transfer fluid in a vapor state within the chamber; and
   soldering the solder members by supplying the heat transfer fluid in the vapor state to surfaces of the solder members through the plurality of the vapor passage holes of the airflow control cover.

2. The method of claim 1, wherein the airflow control cover comprises metal or ceramic.

3. The method of claim 1, wherein each of the plurality of the vapor passage hole has an aspect ratio less than 1.

4. The method of claim 1, wherein a thickness of the airflow control cover is within a range of 10% to 500% of a thickness of the substrate.

5. The method of claim 1, wherein the plurality of vapor passage holes vertically overlap the solder members respectively.

6. The method of claim 1, wherein the plurality of vapor passage holes are spaced apart from each other along a circumference of one solder member.

7. The method of claim 1, wherein the airflow control cover includes,
   a cover plate extending in a horizontal direction and in which the plurality of vapor passage holes are defined; and
   a support portion vertically extending downward from the cover plate to support the cover plate.

8. The method of claim 1, further comprising:
   coating a solder paste on the plurality of bonding pads before attaching the solder members on the plurality of bonding pads respectively.

9. The method of claim 1, further comprising:
   after attaching the solder members on the plurality of bonding pads respectively, fixing the substrate on a fixing jig,
   wherein loading the substrate into the chamber comprises placing the fixing jig on which the substrate is fixed on a substrate stage in the chamber.

10. The method of claim 9, wherein positioning the airflow control cover on the first surface of the substrate comprises positioning the airflow control cover on the fixing jig.

11. A method of manufacturing an electronic device, the method comprising:
   providing a substrate including a plurality of bonding pads on a first surface of the substrate;
   attaching solder members on respective ones of the plurality of bonding pads;
   positioning an airflow control cover on the first surface of the substrate above the solder members, the airflow control cover including a plurality of vapor passage holes through which air is allowed to flow toward the solder members;
   loading the substrate on which the airflow control cover is positioned into a vapor generating chamber that accommodates a heat transfer fluid therein;
   heating the heat transfer fluid to place the heat transfer fluid in a vapor state within the chamber; and
   soldering the solder members by supplying the heat transfer fluid in the vapor state to surfaces of the solder members through the plurality of the vapor passage holes of the airflow control cover.

12. The method of claim 11, wherein the airflow control cover comprises metal or ceramic.

13. The method of claim 11, wherein each of the plurality of the vapor passage hole has an aspect ratio less than 1.

14. The method of claim 11, wherein the plurality of vapor passage holes vertically overlap respective ones of the solder members.

15. The method of claim 11, wherein the plurality of vapor passage holes are spaced apart from each other along a circumference of respective ones of the solder members.

16. The method of claim 11, wherein the airflow control cover includes, a cover plate extending in a horizontal direction and in which the plurality of vapor passage holes are defined; and a support portion vertically extending downward from the cover plate to support the cover plate.

17. The method of claim 11, further comprising:

coating a solder paste on the plurality of bonding pads before attaching the solder members on respective ones of the plurality of bonding pads.

18. The method of claim 11, further comprising:

after attaching the solder members on respective ones of the plurality of bonding pads, fixing the substrate on a fixing jig, wherein loading the substrate into the chamber comprises placing the fixing jig on which the substrate is fixed on a substrate stage in the chamber.

19. The method of claim 18, wherein positioning the airflow control cover on the first surface of the substrate comprises positioning the airflow control cover on the fixing jig.

20. A method of manufacturing an electronic device, the method comprising:

providing a substrate including a plurality of bonding pads on a first surface of the substrate;

coating a solder paste on the plurality of bonding pads;

attaching solder members on the plurality of bonding pads respectively;

positioning an airflow control cover on the first surface of the substrate above the solder members, the airflow control cover including a plurality of vapor passage holes through which air is allowed to flow toward the solder members;

loading the substrate on which the airflow control cover is positioned into a vapor generating chamber that accommodates a first heat transfer fluid therein;

heating the first heat transfer fluid to create a second heat transfer fluid in a vapor state within the chamber; and soldering the solder members by supplying the second heat transfer fluid in the vapor state to surfaces of the solder members through the plurality of the vapor passage holes of the airflow control cover.

* * * * *